US012800514B2

(12) United States Patent
Nakamura et al.

(10) Patent No.: US 12,800,514 B2
(45) Date of Patent: Nov. 17, 2026

(54) SEMICONDUCTOR INSPECTION APPARATUS, METHOD OF INSPECTING SEMICONDUCTOR WAFER, AND METHOD OF MANUFACTURING SEMICONDUCTOR DEVICE

(71) Applicant: Mitsubishi Electric Corporation, Tokyo (JP)

(72) Inventors: Takuyo Nakamura, Tokyo (JP); Hirofumi Oki, Tokyo (JP); Yasuhiro Kimura, Tokyo (JP); Shinichiro Katsuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 370 days.

(21) Appl. No.: 18/430,590

(22) Filed: Feb. 1, 2024

(65) Prior Publication Data

US 2024/0353351 A1 Oct. 24, 2024

(30) Foreign Application Priority Data

Apr. 18, 2023 (JP) ................................ 2023-067755

(51) Int. Cl.
*G01N 21/95* (2006.01)
*H10P 74/20* (2026.01)

(52) U.S. Cl.
CPC ....... *G01N 21/9505* (2013.01); *H10P 74/203* (2026.01)

(58) Field of Classification Search
CPC .... G01N 21/9505; G01N 21/88; G01N 21/86; G01N 21/00; H10P 74/203
See application file for complete search history.

(56) References Cited

U.S. PATENT DOCUMENTS 7,201,799 B1 * 4/2007 Velidandla .............. C30B 29/36 117/1

FOREIGN PATENT DOCUMENTS

JP 2014-137229 A 7/2014

* cited by examiner

*Primary Examiner* — Georgia Y Epps
*Assistant Examiner* — Don J Williams
(74) *Attorney, Agent, or Firm* — Studebaker Brackett PLLC

(57) ABSTRACT

A semiconductor inspection apparatus includes a defect detection unit and a control unit. The defect detection unit inspects a first main surface of a semiconductor wafer including an SiC crystal having the first main surface and a second main surface and inclined at an off angle in a predetermined direction to detect a first defect which is a crystal defect included in the first main surface, and inspects the second main surface to detect a second defect which is a crystal defect included in the second main surface. The control unit controls the defect detection unit to inspect an inspection region that is a partial region of the second main surface of the semiconductor wafer when the defect detection unit detects the second defect. The inspection region is determined based on the detected position of the first defect, and the thickness and the off angle of the semiconductor wafer.

20 Claims, 8 Drawing Sheets

SEMICONDUCTOR INSPECTION APPARATUS, METHOD OF INSPECTING SEMICONDUCTOR WAFER, AND METHOD OF MANUFACTURING SEMICONDUCTOR DEVICE

BACKGROUND OF THE INVENTION

Field of the Invention

The present disclosure relates to a semiconductor inspection apparatus, a method of inspecting a semiconductor wafer, and a method of manufacturing a semiconductor device.

Description of the Background Art

A through defect called a micropipe is easily formed in an SiC wafer. The inspection apparatus described in Japanese Patent Application Laid-Open No. 2014-137229 captures an image of the entire surface of one main surface of the SiC wafer, performs image processing on the image, and detects a defect on the SiC wafer and its address. Then, the inspection apparatus determines presence of the micropipe defect by collating addresses of dotted low-luminance images of the entire surface of one main surface or the entire surfaces of one main surface and the other main surface of the same SiC wafer of two SiC wafers adjacent to each other manufactured by being cut out from the same ingot.

An inspection method for detecting a micropipe defect by inspecting the entire surface of one main surface or the entire surfaces of one main surface and the other main surface of the same wafer of two wafers adjacent to each other manufactured by being cut out from the same ingot takes time to detect the defect.

SUMMARY

An object of the present disclosure is to provide a semiconductor inspection apparatus capable of shortening a detection time of a micropipe defect.

A semiconductor inspection apparatus according to the present disclosure includes a defect detection unit and a control unit. The defect detection unit inspects a first main surface of a semiconductor wafer including an SiC crystal having a first main surface and a second main surface and inclined at an off angle in a predetermined direction to detect a first defect which is a crystal defect included in the first main surface, and inspects the second main surface to detect a second defect which is a crystal defect included in the second main surface. The control unit controls the defect detection unit to inspect an inspection region that is a partial region of the second main surface of the semiconductor wafer when the defect detection unit detects the second defect. The inspection region is determined based on a detected position of the first defect, the thickness of the semiconductor wafer, and the off angle.

Provided is a semiconductor inspection apparatus that shortens a micropipe defect detection time.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Preferred Embodiment

Figure 1:
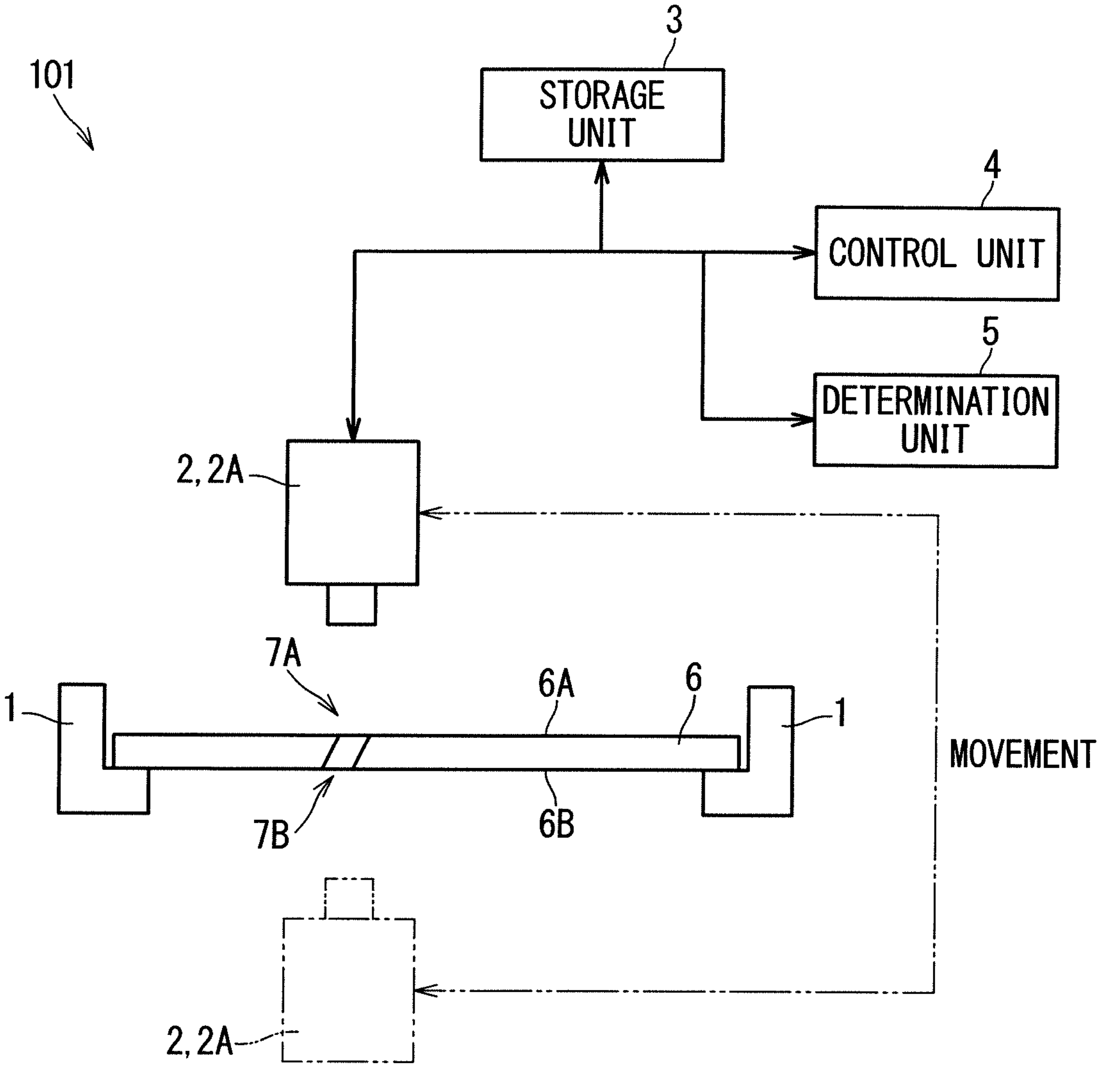
FIG. 1 is a diagram illustrating a configuration of a semiconductor inspection apparatus according to a first preferred embodiment.

FIG. 1 is a diagram illustrating a configuration of a semiconductor inspection apparatus 101 according to a first preferred embodiment. The semiconductor inspection apparatus 101 includes a holding unit 1, a defect detection unit 2, a storage unit 3, a control unit 4, and a determination unit 5.

Figure 2:
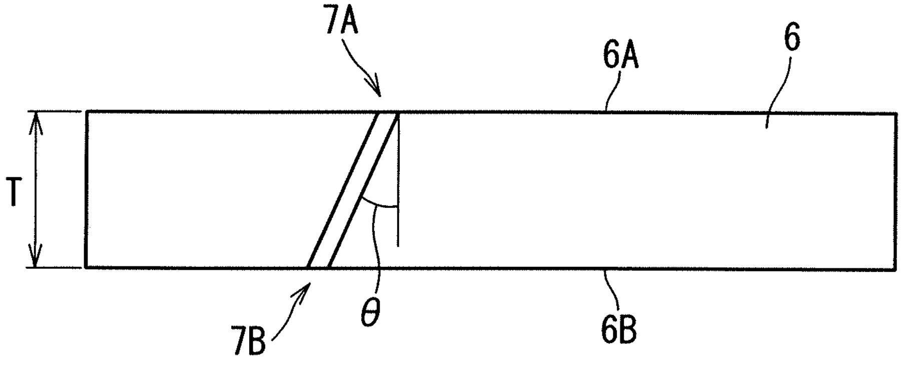
FIG. 2 is a cross-sectional view illustrating a configuration of a SiC wafer.

The semiconductor inspection apparatus 101 inspects the SiC wafer 6 and detects a micropipe defect included in the SiC wafer 6. FIG. 2 is a cross-sectional view illustrating a configuration of the SiC wafer 6. The SiC wafer 6 contains an SiC crystal. The SiC crystal is inclined at an off angle θ in a predetermined direction. The SiC wafer 6 has a thickness T. The SiC wafer 6 includes a first main surface 6A and a second main surface 6B. The second main surface 6B is a surface opposite to the first main surface 6A. For example, the first main surface 6A is a front surface of the SiC wafer 6, and the second main surface 6B is a back surface of the SiC wafer 6.

The holding unit 1 holds the SiC wafer 6 to be inspected. The holding unit 1 preferably holds the outer peripheral portion of the SiC wafer 6.

The defect detection unit 2 inspects the first main surface 6A of the SiC wafer 6 and detects crystal defects included in the first main surface 6A. Hereinafter, the crystal defect in the first main surface 6A is referred to as a first defect 7A. In addition, the defect detection unit 2 inspects the second main surface 6B of the SiC wafer 6 and detects crystal defects included in the second main surface 6B. Hereinafter, the crystal defect in the second main surface 6B is referred to as a second defect 7B.

The defect detection unit 2 in the first preferred embodiment includes an observation unit 2A that optically observes the SiC wafer 6. The observation unit 2A captures an image of the first main surface 6A when inspecting the first main surface 6A of the SiC wafer 6. The observation unit 2A may capture an image of the entire surface of the first main surface 6A, or may image a predetermined region of the first main surface 6A. The observation unit 2A executes image processing on the image of the first main surface 6A to detect the first defect 7A. As described above, the observation unit 2A detects the first defect 7A based on the image of the first main surface 6A captured as the inspection of the first main surface 6A of the SiC wafer 6.

Similarly, when inspecting the second main surface 6B of the SiC wafer 6, the observation unit 2A captures an image of the second main surface 6B. The observation unit 2A captures an image of an inspection region to be described later in the second main surface 6B. The observation unit 2A executes image processing on the image of the inspection region of the second main surface 6B to detect the second defect 7B. As described above, the observation unit 2A detects the second defect 7B based on the image of the inspection region of the second main surface 6B captured as the inspection of the second main surface 6B of the SiC wafer 6.

In addition, the defect detection unit 2 in the first preferred embodiment includes moving means (not illustrated) for moving between a position where the first main surface 6A of the SiC wafer 6 is inspected and a position where the second main surface 6B is inspected.

The storage unit 3 stores the position information of the first defect 7A detected by the observation unit 2A. The storage unit 3 may store information of the thickness T and the off angle θ of the SiC wafer 6 in advance.

When the observation unit 2A detects the second defect 7B, the control unit 4 determines the inspection region in the second main surface 6B of the SiC wafer 6 based on the detected position of the first defect 7A, and the thickness T and the off angle θ of the SiC wafer 6. The inspection region corresponds to a partial region of the second main surface 6B. For example, the control unit 4 reads information of the detected position of the first defect 7A, and the thickness T and the off angle θ of the SiC wafer 6, stored in the storage unit 3, and determines the inspection region. When the second defect 7B is detected, the control unit 4 controls the observation unit 2A such that the observation unit 2A inspects the inspection region.

The inspection region includes a position on the second main surface 6B away from the detected position of the first defect 7A by a distance of $T \times \tan\theta$ in a predetermined direction in plan view. Hereinafter, this position is referred to as a first defect corresponding position. The predetermined direction is a direction in which the SiC crystal is inclined by the off angle θ, and is a direction parallel to the second main surface 6B.

When the detected position of the second defect 7B coincides with the first defect corresponding position, the determination unit 5 determines that the first defect 7A and the second defect 7B are micropipe defects penetrating the first main surface 6A and the second main surface 6B of the SiC wafer 6. In this case, the micropipe defect is formed by the pair of first defect 7A and second defect 7B.

The control unit 4 includes a processor (not illustrated) such as a central processing unit (CPU). The above-described functions of the control unit 4 are implemented by a processor executing a program stored in a memory (not illustrated). Similarly, the function of the determination unit 5 is implemented by execution of a program by the processor.

Figure 3:
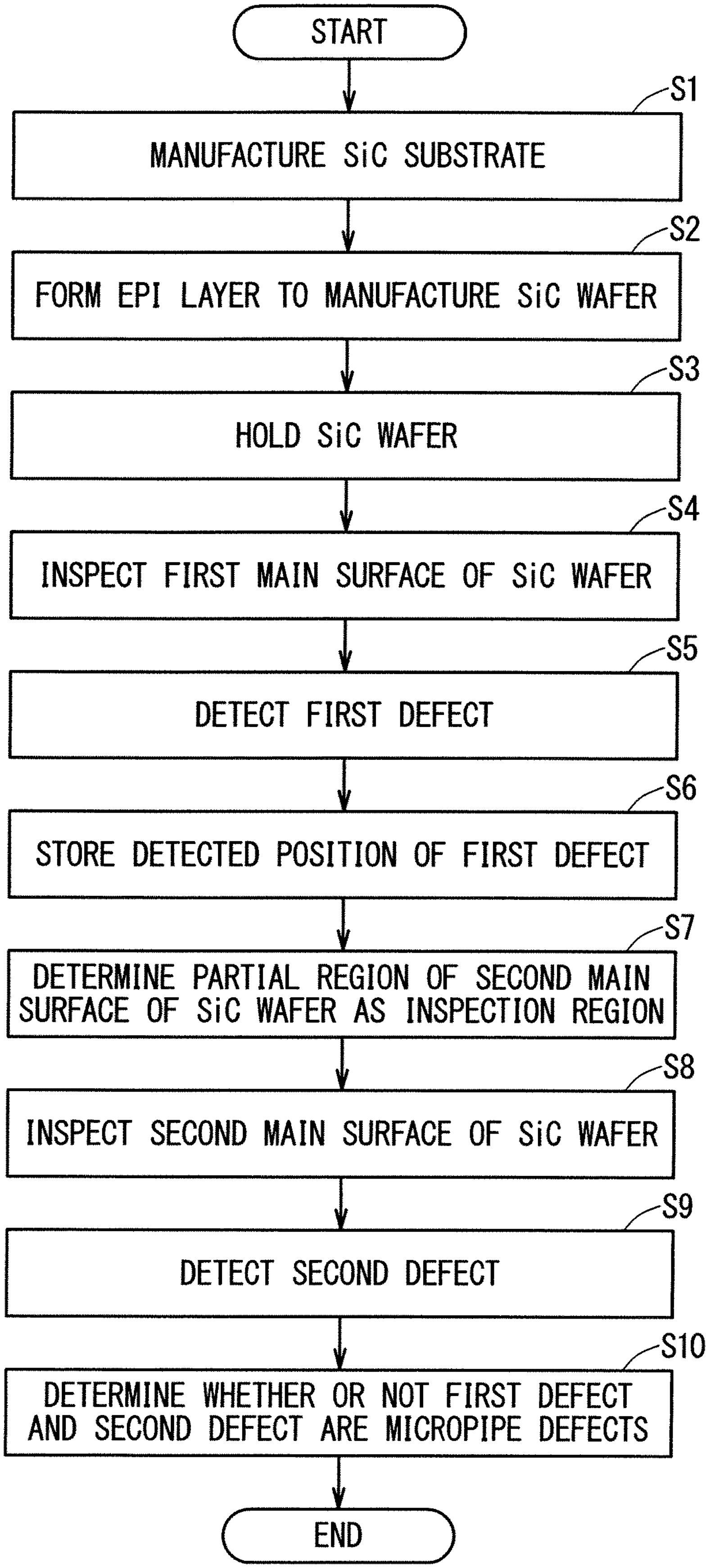
FIG. 3 is a flowchart illustrating a method of inspecting an SiC wafer according to the first preferred embodiment.

FIG. 3 is a flowchart illustrating a method of inspecting the SiC wafer 6 according to the first preferred embodiment.

In step S1, an SiC substrate (not illustrated) is manufactured. For example, an n-type SiC substrate is manufactured. In step S1, a micropipe defect penetrating the SiC substrate is formed.

In step S2, an n-type SiC epi layer (not illustrated) is formed on the surface of the SiC substrate. The micropipe defects penetrating the SiC substrate are also taken over in this epitaxial growth. The impurity concentration of the n-type SiC epi layer is lower than the impurity concentration of the n-type SiC substrate. By this step S2, the SiC wafer 6 of the thickness T to be inspected is manufactured.

In step S3, the SiC wafer 6 is held by the holding unit 1.

In step S4, the defect detection unit 2 inspects the first main surface 6A of the SiC wafer 6. Here, the observation unit 2A captures an image of the first main surface 6A of the SiC wafer 6.

In step S5, the defect detection unit 2 detects the first defect 7A based on the inspection result of the first main surface 6A of the SiC wafer 6. Here, the observation unit 2A executes image processing on the image of the first main surface 6A of the SiC wafer 6 to detect the first defect 7A.

In step S6, the storage unit 3 stores the detected position of the first defect 7A. The position information is, for example, coordinate information.

In step S7, the control unit 4 determines a partial region of the second main surface 6B of the SiC wafer 6 as an inspection region based on the detected position of the first defect 7A, and the thickness T and the off angle θ of the SiC wafer 6. The inspection region in the first preferred embodiment includes a first defect corresponding position. The first defect corresponding position corresponds to a position on the second main surface 6B away from the detected position of the first defect 7A by a distance of $T \times \tan\theta$ in a predetermined direction in plan view. The control unit 4 controls the observation unit 2A so that the observation unit 2A inspects the inspection region.

In step S8, the defect detection unit 2 inspects the second main surface 6B of the SiC wafer 6. At this time, the observation unit 2A, which is the defect detection unit 2, is moved by the moving means from a position where the first main surface 6A of the SiC wafer 6 is inspected to a position where the second main surface 6B is inspected. After the movement, the observation unit 2A captures an image of the inspection region in the second main surface 6B of the SiC wafer 6.

In step S9, the defect detection unit 2 detects the second defect 7B based on the inspection result of the second main surface 6B of the SiC wafer 6. Here, the observation unit 2A executes image processing on the image of the inspection region of the second main surface 6B of the SiC wafer 6 to detect the second defect 7B.

In step S10, when the detected position of the second defect 7B coincides with the first defect corresponding position, the determination unit 5 determines that the first defect 7A and the second defect 7B are micropipe defects penetrating the first main surface 6A and the second main surface 6B of the SiC wafer 6.

The above steps S1 to S10 are the method of inspecting the SiC wafer 6 according to the first preferred embodiment.

The SiC wafer 6 to be inspected is a wafer for manufacturing a semiconductor device. After this inspection, a plurality of semiconductor elements may be formed on the SiC wafer 6. The semiconductor element is, for example, an insulated gate bipolar transistor (IGBT), a metal oxide semiconductor field effect transistor (MOSFET), a Schottky barrier diode, or the like. Alternatively, the semiconductor element may be a reverse-conducting IGBT (RC-IGBT) in which an IGBT and a freewheeling diode are formed in one chip. After the semiconductor element is formed in the SiC wafer 6, the SiC wafer 6 is formed into a chip, and a plurality of semiconductor devices each including a semiconductor element are manufactured. The above is the method of manufacturing the semiconductor device.

In summary, the semiconductor inspection apparatus 101 according to the first preferred embodiment includes the defect detection unit 2 and the control unit 4. The defect detection unit 2 inspects the first main surface 6A of the SiC wafer 6 including the SiC crystal having the first main surface 6A and the second main surface 6B and inclined at the off angle θ in the predetermined direction to detect the first defect 7A which is the crystal defect included in the first main surface 6A, and inspects the second main surface 6B to detect the second defect 7B which is the crystal defect included in the second main surface 6B. When the defect detection unit 2 detects the second defect 7B, the control unit 4 controls the defect detection unit 2 so as to inspect an inspection region that is a partial region of the second main surface 6B of the SiC wafer 6. The inspection region is determined based on the detected position of the first defect 7A, and the thickness T and the off angle θ of the SiC wafer 6.

The SiC wafer 6 is manufactured so as to have an off angle θ for controlling crystal defects. The off angle θ is, for example, 4°. The micropipe defect generated in the SiC crystal extends in the 0001 direction of the crystal orientation. In other words, the micropipe defect penetrating the SiC wafer 6 is inclined at the off angle θ with respect to the surface of the SiC wafer 6. Therefore, the position of the first defect 7A on the first main surface 6A and the position of the second defect 7B on the second main surface 6B caused by the micropipe are shifted by a distance corresponding to the thickness T and the off angle θ in plan view.

Therefore, when the semiconductor inspection apparatus 101 detects a micropipe defect, it is only required to inspect a partial region of the second main surface 6B. In other words, the semiconductor inspection apparatus 101 does not inspect the entire second main surface 6B after inspecting the first main surface 6A. The semiconductor inspection apparatus 101 restrictively inspects the inspection region determined based on the detected position of the first defect 7A, and the thickness T and the off angle θ of the SiC wafer 6. Therefore, the detection time of the micropipe defect is shortened. In addition, it is not necessary to prepare two SiC wafers manufactured from the same ingot, and it is possible to detect a micropipe defect only by inspecting one SiC wafer 6.

In addition, the defect detection unit 2 of the first preferred embodiment includes an observation unit 2A that optically observes the SiC wafer 6. The observation unit 2A determines whether or not it is a defect by a shape or the like appearing in an image. Therefore, the observation unit 2A does not erroneously determine the shadow or the like due to the surface morphology of the SiC wafer 6 as the through-hole caused by the micropipe defect. The inspection accuracy is high, and the micropipe defect is efficiently detected.

The micropipe defect penetrating the SiC wafer 6 causes various troubles in the manufacturing process of the semiconductor device. For example, chucking failure between the manufacturing apparatus and the SiC wafer 6, contamination of the back surface due to infiltration of the process material from the front surface of the SiC wafer 6 through the micropipe defect, and the like occur. If the position of the micropipe defect is clear in advance, various countermeasures can be taken. For example, the SiC wafer 6 may be excluded as a defective product according to the position or the number of micropipe defects. Alternatively, for example, a semiconductor device formed at a position where a micropipe defect exists can be excluded as a defective product.

Modification of First Preferred Embodiment

The control unit 4 may determine the inspection region such that only the first defect corresponding position is included in the inspection region. In this case, the observation unit 2A inspects the inspection region including the first defect corresponding position and the periphery thereof. The detection time of the micropipe defect is further shortened.

Second Preferred Embodiment

In the second preferred embodiment, the same components as those in the first preferred embodiment are denoted by the same reference numerals, and detailed description thereof will be omitted.

Figure 4:
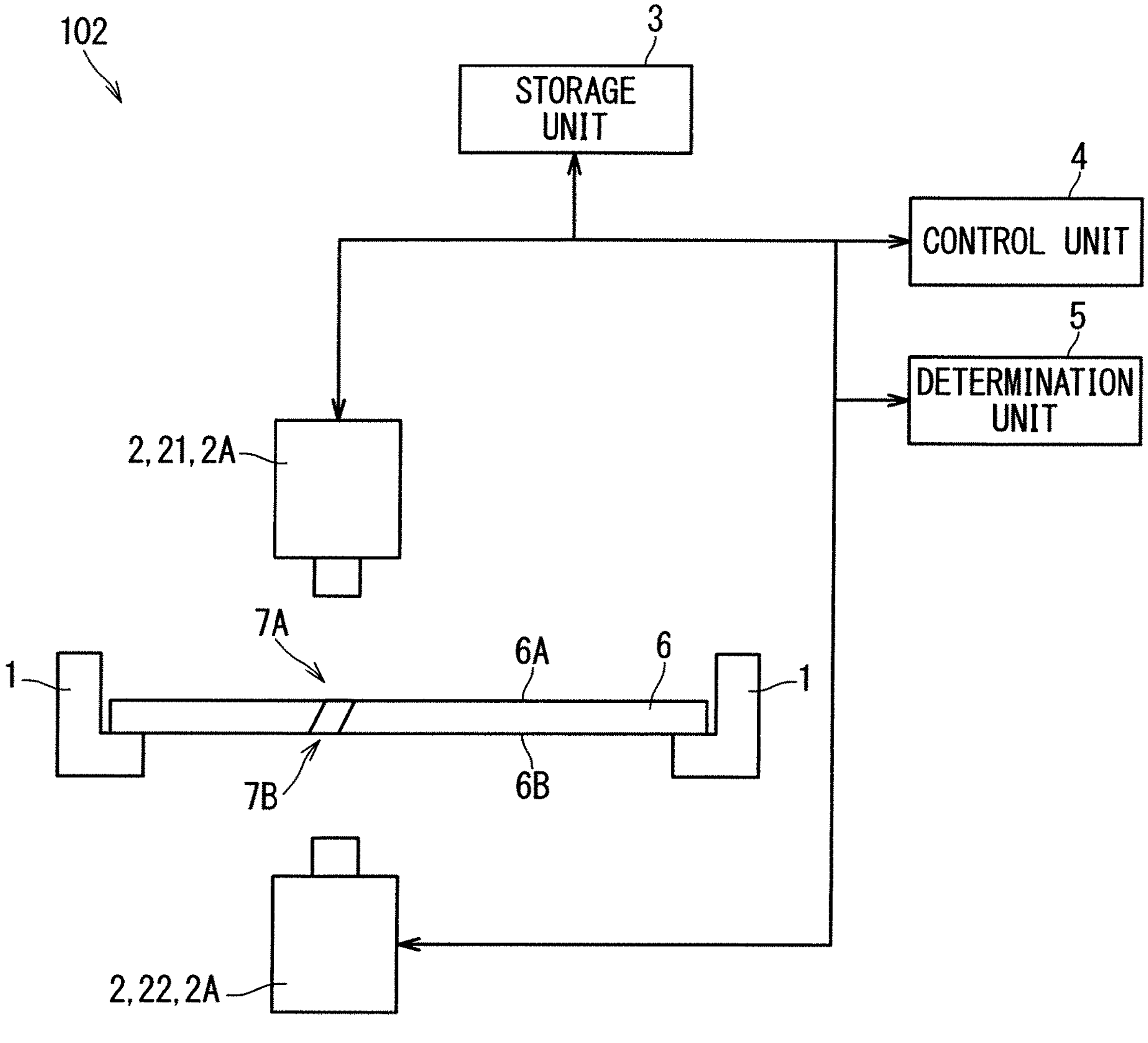
FIG. 4 is a diagram illustrating a configuration of a semiconductor inspection apparatus according to a second preferred embodiment.

FIG. 4 is a diagram illustrating a configuration of a semiconductor inspection apparatus 102 according to the second preferred embodiment. The defect detection unit 2 of the semiconductor inspection apparatus 102 includes a first defect detection unit 21 and a second defect detection unit 22. The first defect detection unit 21 inspects the first main surface 6A of the SiC wafer 6. The second defect detection unit 22 inspects the second main surface 6B of the SiC wafer 6. Each of the first defect detection unit 21 and the second defect detection unit 22 in the second preferred embodiment includes an observation unit 2A that optically observes the SiC wafer 6.

According to such a configuration, it is not necessary for the defect detection unit 2 to include moving means for moving between a position where the first main surface 6A of the SiC wafer 6 is inspected and a position where the second main surface 6B is inspected. In addition, it is not necessary for the semiconductor inspection apparatus 102 to include reversing means that reverses the SiC wafer 6 for inspecting the second main surface 6B of SiC wafer 6. Since a drive mechanism such as the moving means and the reversing means is not provided, the cost of the semiconductor inspection apparatus 102 is reduced. In addition, the time required for reversing the inspection target surface in the inspection process is reduced.

Third Preferred Embodiment

In the third preferred embodiment, the same components as those in the first or second preferred embodiment are denoted by the same reference numerals, and detailed description thereof will be omitted.

Figure 5:
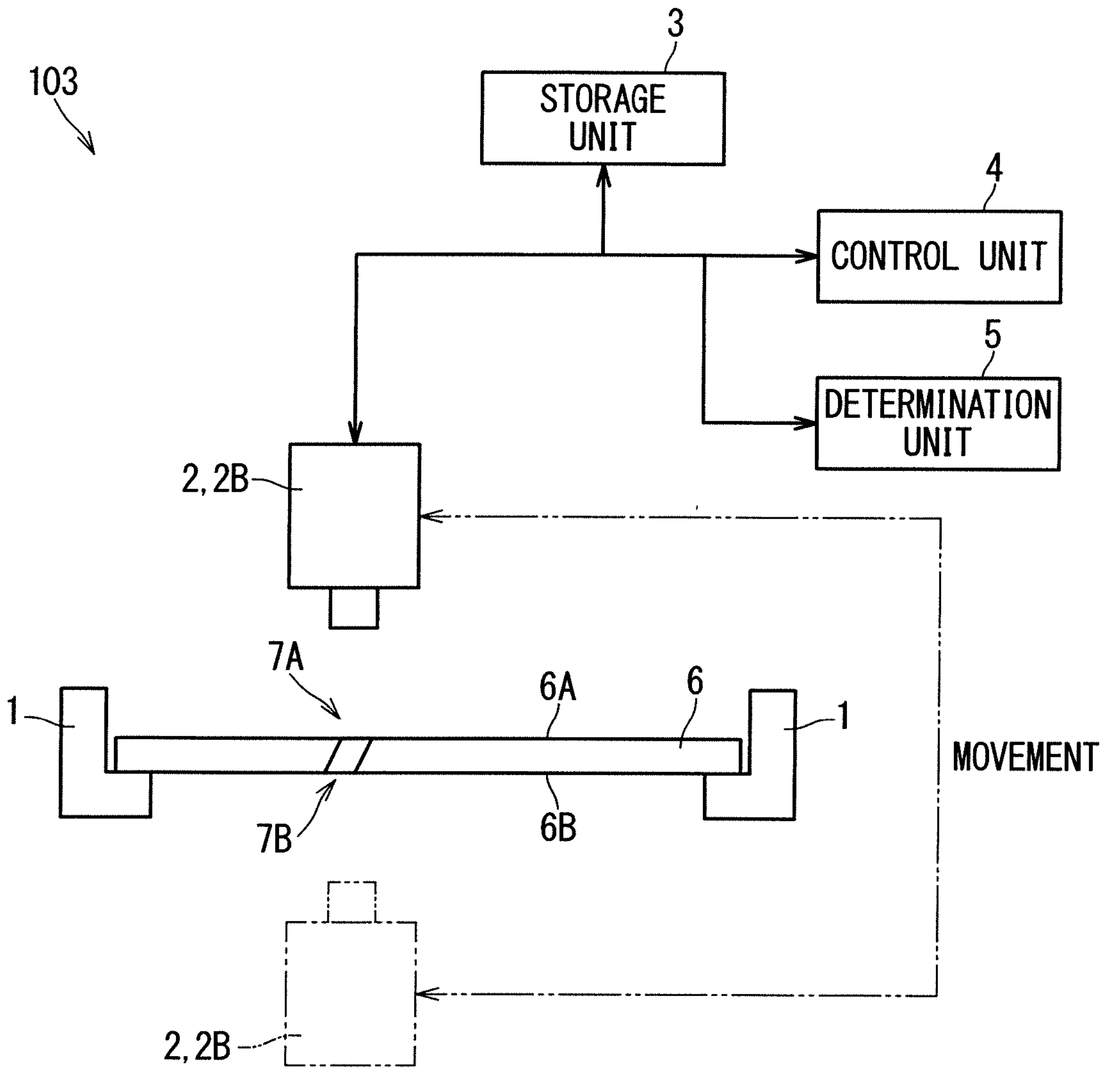
FIG. 5 is a diagram illustrating a configuration of a semiconductor inspection apparatus according to a third preferred embodiment.

FIG. 5 is a diagram illustrating a configuration of a semiconductor inspection apparatus 103 according to the third preferred embodiment. The defect detection unit 2 of the semiconductor inspection apparatus 103 includes a displacement measurement unit 2B. The displacement measurement unit 2B inspects displacement on the first main surface 6A and the second main surface 6B of the SiC wafer 6 by contact or non-contact means. The contact type means is, for example, a step profiler. The non-contact means is, for example, a laser displacement meter.

When inspecting the first main surface 6A of the SiC wafer 6, the displacement measurement unit 2B measures the displacement of the first main surface 6A. The displacement measurement unit 2B may measure displacement of the entire surface of the first main surface 6A, or may measure displacement of a predetermined region of the first main surface 6A. The displacement measurement unit 2B detects the recess based on the displacement of the first main surface 6A. This recess corresponds to the first defect 7A. As described above, the displacement measurement unit 2B detects the first defect 7A based on the displacement in the first main surface 6A measured as the inspection of the first main surface 6A of the SiC wafer 6.

Similarly, when inspecting the second main surface 6B of the SiC wafer 6, the displacement measurement unit 2B measures the displacement of the second main surface 6B. The displacement measurement unit 2B measures the displacement of the inspection region in the second main surface 6B. The displacement measurement unit 2B detects the recess based on the displacement of the inspection region of the second main surface 6B. This recess corresponds to the second defect 7B. As described above, the displacement measurement unit 2B detects the second defect 7B based on the displacement in the inspection region of the second main surface 6B measured as the inspection of the second main surface 6B of the SiC wafer 6.

In addition, similarly to the first preferred embodiment, the displacement measurement unit 2B in the second preferred embodiment includes moving means (not illustrated) for moving between a position where the first main surface 6A of the SiC wafer 6 is inspected and a position where the second main surface 6B is inspected.

The storage unit 3 stores the position of the recess on the first main surface 6A detected by the displacement measurement unit 2B, that is, the position information of the first defect 7A. The storage unit 3 may store information of the thickness T and the off angle θ of the SiC wafer 6 in advance.

When the second defect 7B is detected by the displacement measurement unit 2B, the control unit 4 determines the inspection region in the second main surface 6B of the SiC wafer 6 based on the detected position of the first defect 7A, and the thickness T and the off angle θ of the SiC wafer 6. The inspection region corresponds to a partial region of the second main surface 6B. For example, the control unit 4 reads information of the detected position of the first defect 7A, and the thickness T and the off angle θ of the SiC wafer 6, stored in the storage unit 3, and determines the inspection region. When detecting the second defect 7B, the control unit 4 controls the displacement measurement unit 2B so that the displacement measurement unit 2B inspects the inspection region.

The inspection region includes a first defect corresponding position on the second main surface 6B away from the detected position of the first defect 7A by a distance of $T \times \tan \theta$ in a predetermined direction in plan view.

When the detected position of the second defect 7B coincides with the first defect corresponding position, the determination unit 5 determines that the first defect 7A and the second defect 7B are micropipe defects penetrating the first main surface 6A and the second main surface 6B of the SiC wafer 6.

The displacement measurement unit 2B of the semiconductor inspection apparatus 103 as described above numerically detects the degree of unevenness of the first main surface 6A and the second main surface 6B of the SiC wafer 6. The determination unit 5 directly executes the determination of the crystal defect using the numerical value. Therefore, the defect determination processing is simple, the configuration of the semiconductor inspection apparatus 103 is relatively simple, and the cost thereof is also inexpensive.

Fourth Preferred Embodiment

In the fourth preferred embodiment, the same components as those in any one of the first to third preferred embodiments are denoted by the same reference numerals, and detailed description thereof will be omitted.

Figure 6:
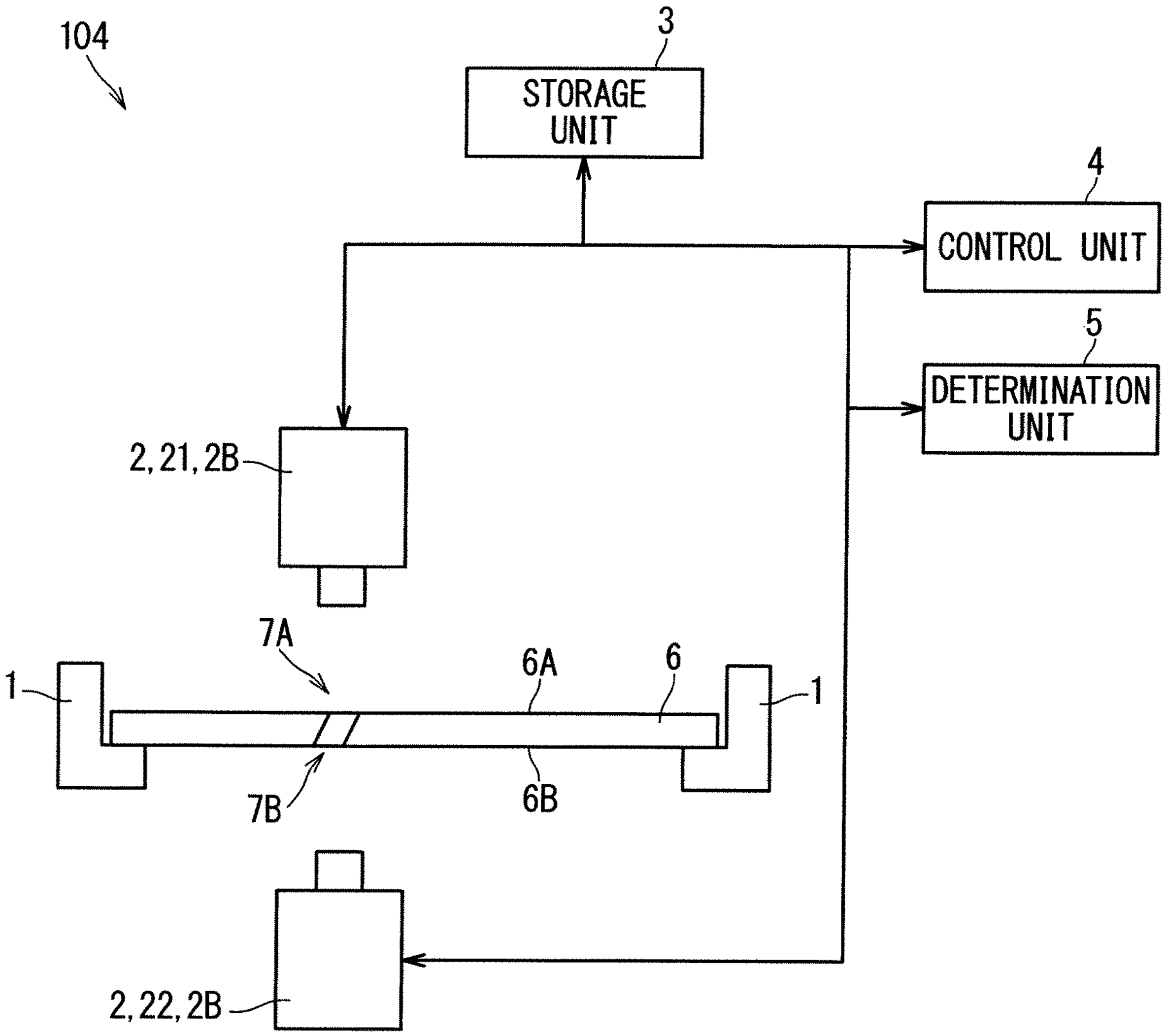
FIG. 6 is a diagram illustrating a configuration of a semiconductor inspection apparatus according to a fourth preferred embodiment.

FIG. 6 is a diagram illustrating a configuration of a semiconductor inspection apparatus 104 according to the fourth preferred embodiment. The defect detection unit 2 of the semiconductor inspection apparatus 104 includes a first defect detection unit 21 and a second defect detection unit 22. The first defect detection unit 21 inspects the first main surface 6A of the SiC wafer 6. The second defect detection unit 22 inspects the second main surface 6B of the SiC wafer 6. Each of the first defect detection unit 21 and the second defect detection unit 22 in the fourth preferred embodiment includes a displacement measurement unit 2B similar to that in the third preferred embodiment.

According to such a configuration, it is not necessary for the defect detection unit 2 to include moving means for moving between a position where the first main surface 6A of the SiC wafer 6 is inspected and a position where the second main surface 6B is inspected. In addition, it is not necessary for the semiconductor inspection apparatus 104 to include reversing means that reverses the SiC wafer 6 in order to inspect the second main surface 6B of the SiC wafer 6. Since a drive mechanism such as the moving means and the reversing means is not provided, the cost of the semiconductor inspection apparatus 104 is reduced. In addition, the time required for reversing the inspection target surface in the inspection process is reduced.

Fifth Preferred Embodiment

In the fifth preferred embodiment, the same components as those in any of the first to fourth preferred embodiments are denoted by the same reference numerals, and detailed description thereof will be omitted.

Figure 7:
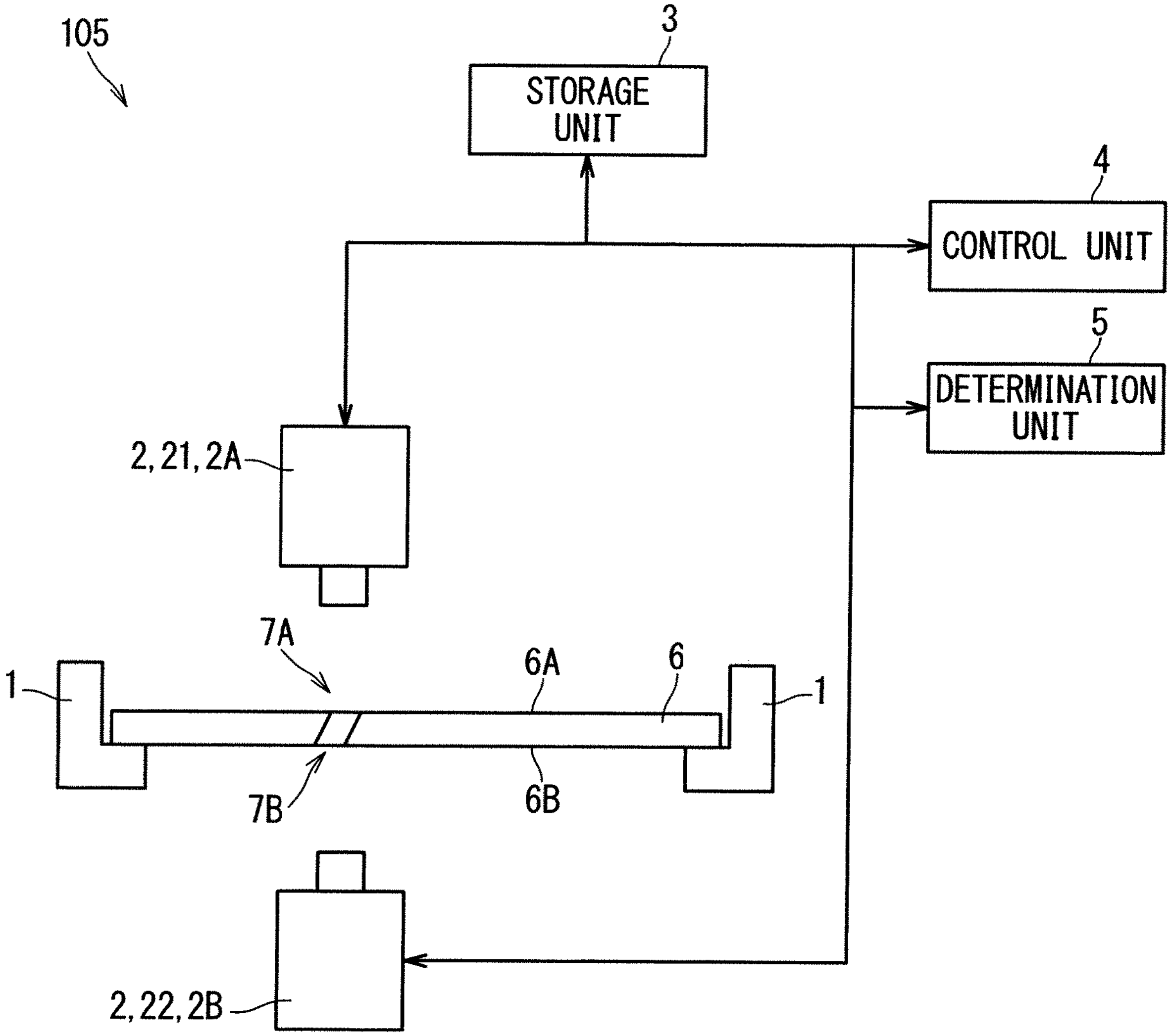
FIG. 7 is a diagram illustrating a configuration of a semiconductor inspection apparatus according to a fifth preferred embodiment.

FIG. 7 is a diagram illustrating a configuration of a semiconductor inspection apparatus 105 according to the fifth preferred embodiment. The defect detection unit 2 of the semiconductor inspection apparatus 105 includes a first defect detection unit 21 and a second defect detection unit 22. The first defect detection unit 21 includes an observation unit 2A similar to that of the second preferred embodiment, and the second defect detection unit 22 includes a displacement measurement unit 2B similar to that of the fourth preferred embodiment.

When inspecting the first main surface 6A of the SiC wafer 6, the observation unit 2A captures an image of the first main surface 6A. The observation unit 2A executes image processing on the image of the first main surface 6A to detect the first defect 7A. As described above, the observation unit 2A detects the first defect 7A based on the image of the first main surface 6A captured as the inspection of the first main surface 6A of the SiC wafer 6.

When inspecting the second main surface 6B of the SiC wafer 6, the displacement measurement unit 2B measures the displacement of the second main surface 6B. The displacement measurement unit 2B measures the displacement of the inspection region in the second main surface 6B. The displacement measurement unit 2B detects the recess based on the displacement of the inspection region of the second main surface 6B. This recess corresponds to the second defect 7B. As described above, the displacement measurement unit 2B detects the second defect 7B based on the displacement in the inspection region of the second main surface 6B measured as the inspection of the second main surface 6B of the SiC wafer 6.

The storage unit 3 stores information on the position of the first defect 7A detected by the observation unit 2A. The storage unit 3 may store information of the thickness T and the off angle θ of the SiC wafer 6 in advance.

When the second defect 7B is detected by the displacement measurement unit 2B, the control unit 4 determines a partial region of the second main surface 6B of the SiC wafer 6 as an inspection region based on the detected position of the first defect 7A, and the thickness T and the off angle θ of the SiC wafer 6. For example, the control unit 4 reads information of the detected position of the first defect 7A, and the thickness T and the off angle θ of the SiC wafer 6, stored in the storage unit 3, and determines the inspection region. When detecting the second defect 7B, the control unit 4 controls the displacement measurement unit 2B so that the displacement measurement unit 2B inspects the inspection region.

The inspection region includes a first defect corresponding position on the second main surface 6B away from the detected position of the first defect 7A by a distance of T×tan θ in a predetermined direction in plan view.

When the detected position of the second defect 7B coincides with the first defect corresponding position, the determination unit 5 determines that the first defect 7A and the second defect 7B are micropipe defects penetrating the first main surface 6A and the second main surface 6B of the SiC wafer 6.

Although not illustrated, the observation unit 2A and the displacement measurement unit 2B may be exchanged. That is, the first defect detection unit 21 may include the displacement measurement unit 2B similar to that of the fourth preferred embodiment, and the second defect detection unit 22 may include the observation unit 2A similar to that of the second preferred embodiment.

The observation unit 2A and the displacement measurement unit 2B complement each other with advantages. Either the observation unit 2A or the displacement measurement unit 2B is selectively provided according to the tendency of the occurrence of the defect on the first main surface 6A and the tendency of the occurrence of the defect on the second main surface 6B.

Sixth Preferred Embodiment

In the sixth preferred embodiment, the same components as those in any of the first to fifth preferred embodiments are denoted by the same reference numerals, and detailed description thereof will be omitted.

Figure 8:
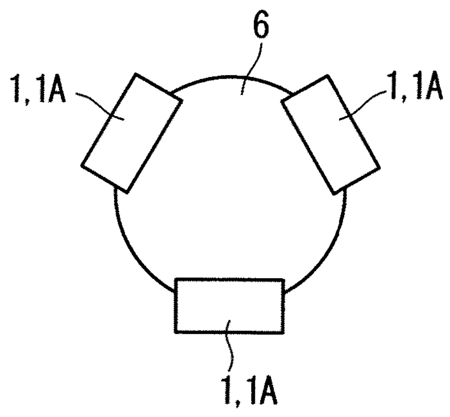
FIG. 8 is a diagram illustrating a configuration of a holding unit of a semiconductor inspection apparatus according to a sixth preferred embodiment.

FIG. 8 is a diagram illustrating a configuration of a holding unit 1 of the semiconductor inspection apparatus according to the sixth preferred embodiment. The holding unit 1 holds the outer peripheral portion of the SiC wafer 6. The holding unit 1 includes three gripping portions 1A. Each of the three gripping portions 1A sandwiches and holds the SiC wafer 6 from both sides of the first main surface 6A and the second main surface 6B of the SiC wafer 6. The number of gripping portions 1A is not limited to three, and may be four or more.

In addition, the holding unit 1 includes reversing means (not illustrated) that reverses the SiC wafer 6 so that the position of the first main surface 6A and the position of the second main surface 6B of the SiC wafer 6 are switched. By providing the reversing means, for example, it is possible to inspect both the first main surface 6A and the second main surface 6B of the SiC wafer 6 with only one defect detection unit 2.

With such a configuration, the handling time of the SiC wafer 6 is shortened. In addition, generation of foreign matter and adhesion of the foreign matter to the SiC wafer 6 are prevented.

Seventh Preferred Embodiment

In the seventh preferred embodiment, the same components as those in any one of the first to sixth preferred embodiments are denoted by the same reference numerals, and detailed description thereof is omitted.

Figure 9:
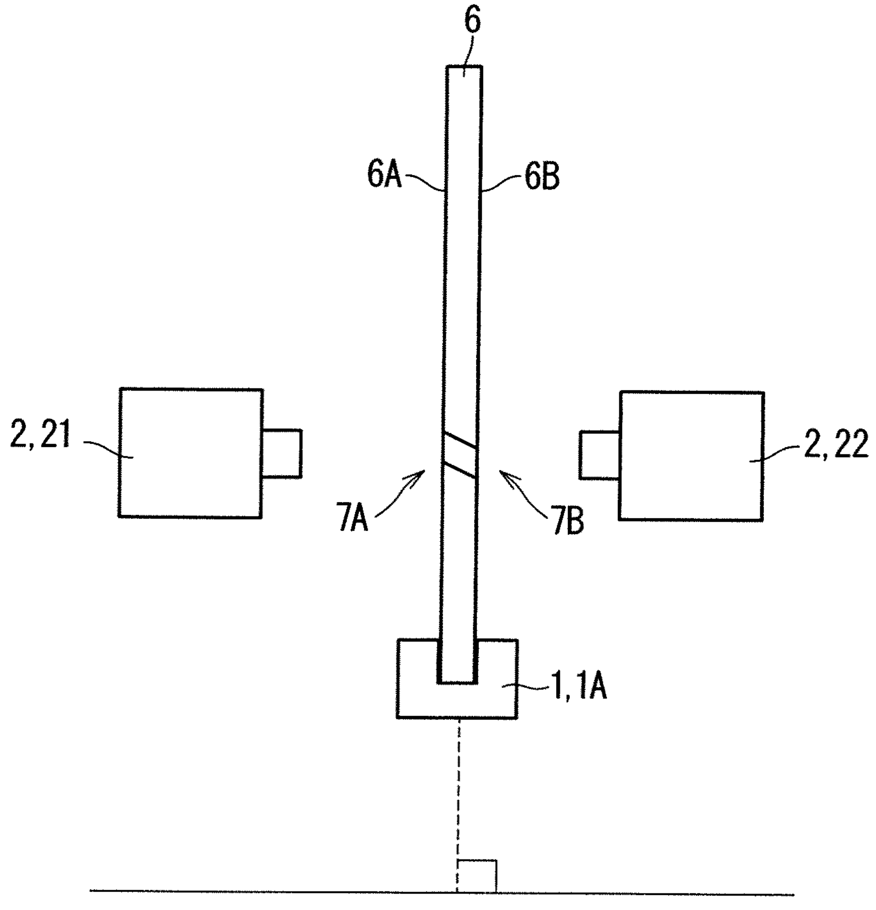
FIG. 9 is a diagram illustrating a holding state of an SiC wafer according to a seventh preferred embodiment.

FIG. 9 is a diagram illustrating a holding state of the SiC wafer 6 in the seventh preferred embodiment. When the defect detection unit 2 inspects the SiC wafer 6, the holding unit 1 holds the semiconductor wafer in the vertical direction. With such a configuration, adhesion of foreign matter to the first main surface 6A or the second main surface 6B from above the SiC wafer 6 is prevented.

In the present disclosure, the preferred embodiments can be freely combined, and the preferred embodiments can be appropriately modified or omitted.

Hereinafter, various aspects of the present disclosure will be collectively described as Appendixes.

APPENDIX 1

A semiconductor inspection apparatus comprising:

a defect detection unit that inspects a first main surface of a semiconductor wafer including an SiC crystal having the first main surface and a second main surface and inclined at an off angle in a predetermined direction to detect a first defect which is a crystal defect included in the first main surface, and inspects the second main surface to detect a second defect which is a crystal defect included in the second main surface; and a control unit that controls the defect detection unit so as to inspect an inspection region, which is determined based on a detected position of the first defect, and a thickness and the off angle of the semiconductor wafer, and is a partial region of the second main surface of the semiconductor wafer, when the defect detection unit detects the second defect.

APPENDIX 2

The semiconductor inspection apparatus according to Appendix 1, wherein when the thickness and the off angle of the semiconductor wafer are denoted by T and θ, respectively, the inspection region includes a first defect corresponding position that is a position on the second main surface of the semiconductor wafer away from the detected position of the first defect by a distance of T×tan θ in the predetermined direction in plan view.

APPENDIX 3

The semiconductor inspection apparatus according to Appendix 2, wherein the inspection region includes only the first defect corresponding position on the second main surface of the semiconductor wafer.

APPENDIX 4

The semiconductor inspection apparatus according to any one of Appendixes 1 to 3, further comprising a storage unit that stores the detected position of the first defect detected by the defect detection unit, wherein the control unit determines the inspection region based on the detected position of the first defect stored in the storage unit.

APPENDIX 5

The semiconductor inspection apparatus according to any one of Appendixes 2 to 4, further comprising a determination unit that determines that the first defect and the second defect are micropipe defects penetrating the first main surface and the second main surface of the semiconductor wafer when a detected position of the second defect coincides with the first defect corresponding position.

APPENDIX 6

The semiconductor inspection apparatus according to any one of Appendixes 1 to 5, wherein the defect detection unit includes an observation unit, and the observation unit detects the first defect based on an image of the first main surface captured as an inspection of the first main surface of the semiconductor wafer, or detects the second defect based on an image of the inspection region of the second main surface captured as an inspection of the second main surface of the semiconductor wafer.

APPENDIX 7

The semiconductor inspection apparatus according to any one of Appendixes 1 to 5, wherein the defect detection unit includes a displacement measurement unit, and the displacement measurement unit detects the first defect based on displacement in the first main surface measured as an inspection of the first main surface of the semiconductor wafer, or detects the second defect based on displacement in the inspection region of the second main surface measured as an inspection of the second main surface of the semiconductor wafer.

APPENDIX 8

The semiconductor inspection apparatus according to any one of Appendixes 1 to 7, wherein the defect detection unit includes a first defect detection unit that inspects the first main surface of the semiconductor wafer and a second defect detection unit that inspects the second main surface of the semiconductor wafer.

APPENDIX 9

The semiconductor inspection apparatus according to Appendix 8, wherein the first defect detection unit includes an observation unit, the second defect detection unit includes a displacement measurement unit, the observation unit detects the first defect based on an image of the first main surface captured as an inspection of the first main surface of the semiconductor wafer, and the displacement measurement unit detects the second defect based on displacement in the inspection region of the second main surface measured as an inspection of the second main surface of the semiconductor wafer.

APPENDIX 10

The semiconductor inspection apparatus according to Appendix 8, wherein the first defect detection unit includes a displacement measurement unit, the second defect detection unit includes an observation unit, the displacement measurement unit detects the first defect based on displacement in the first main surface measured as an inspection of the first main surface of the semiconductor wafer, and the observation unit detects the second defect based on an image of the inspection region of the second main surface captured as an inspection of the second main surface of the semiconductor wafer.

APPENDIX 11

The semiconductor inspection apparatus according to any one of Appendixes 1 to 10, further comprising a holding unit that holds an outer peripheral portion of the semiconductor wafer, wherein the holding unit includes reversing means that reverses the semiconductor wafer such that a position of the first main surface and a position of the second main surface of the semiconductor wafer are switched.

APPENDIX 12

The semiconductor inspection apparatus according to any one of Appendixes 1 to 10, further comprising a holding unit that holds an outer peripheral portion of the semiconductor wafer, wherein the holding unit includes three or more gripping portions, and each of the three or more gripping portions sandwiches and holds the semiconductor wafer from both sides of the first main surface and the second main surface of the semiconductor wafer.

APPENDIX 13

The semiconductor inspection apparatus according to any one of Appendixes 1 to 10, further comprising a holding unit that holds an outer peripheral portion of the semiconductor wafer, wherein the holding unit holds the semiconductor wafer in a vertical direction.

APPENDIX 14

A method of inspecting a semiconductor wafer, the method comprising:

a step of inspecting a first main surface of a semiconductor wafer including an SiC crystal having the first main surface and a second main surface and inclined at an off angle in a predetermined direction to detect a first defect which is a crystal defect included in the first main surface;

a step of inspecting the second main surface of the semiconductor wafer after the step of detecting the first defect to detect a second defect that is a crystal defect included in the second main surface; and a step of controlling, when detecting the second defect, the step of detecting the second defect such that the inspection region, which is an inspection region determined based on the detected position of the first defect, and a thickness and the off angle of the semiconductor wafer, and is a partial region of the second main surface of the semiconductor wafer, is inspected.

APPENDIX 15

The method of inspecting a semiconductor wafer according to Appendix 14, wherein when the thickness and the off angle of the semiconductor wafer are denoted by T and θ, respectively, the inspection region includes a first defect corresponding position that is a position on the second main surface of the semiconductor wafer away from the detected position of the first defect by a distance of T×tan θ in the predetermined direction in plan view.

APPENDIX 16

The method of inspecting a semiconductor wafer according to Appendix 15, the method further comprising a step of determining that the first defect and the second defect are micropipe defects penetrating the first main surface and the second main surface of the semiconductor wafer when the detected position of the second defect coincides with the first defect corresponding position.

APPENDIX 17

The method of inspecting a semiconductor wafer according to any one of Appendixes 14 to 16, wherein the semiconductor wafer is held in a vertical direction.

APPENDIX 18

A method of manufacturing a semiconductor device, the method comprising:

a step of inspecting a first main surface of a semiconductor wafer including an SiC crystal having the first main surface and a second main surface and inclined at an off angle in a predetermined direction to detect a first defect which is a crystal defect included in the first main surface;

a step of inspecting the second main surface of the semiconductor wafer after the step of detecting the first defect to detect a second defect that is a crystal defect included in the second main surface; and a step of controlling, when detecting the second defect, the step of detecting the second defect such that the inspection region, which is an inspection region determined based on the detected position of the first defect, and a thickness and the off angle of the semiconductor wafer, and is a partial region of the second main surface of the semiconductor wafer, is inspected.

APPENDIX 19

The method of manufacturing a semiconductor device according to Appendix 18, wherein when the thickness and the off angle of the semiconductor wafer are denoted by T and θ, respectively, the inspection region includes a first defect corresponding position that is a position on the second main surface of the semiconductor wafer away from the detected position of the first defect by a distance of T×tan θ in the predetermined direction in plan view.

APPENDIX 20

The method of manufacturing a semiconductor device according to Appendix 19, further comprising a step of determining that the first defect and the second defect are micropipe defects penetrating the first main surface and the second main surface of the semiconductor wafer when the detected position of the second defect coincides with the first defect corresponding position.

While the disclosure has been shown and described in detail, the foregoing description is in all aspects illustrative and not restrictive. It is therefore understood that numerous modifications and variations can be devised.

What is claimed is:

1. A semiconductor inspection apparatus comprising:

a defect detection unit that inspects a first main surface of a semiconductor wafer including an SiC crystal having the first main surface and a second main surface and inclined at an off angle in a predetermined direction to detect a first defect which is a crystal defect included in the first main surface, and inspects the second main surface to detect a second defect which is a crystal defect included in the second main surface; and a control circuitry that controls the defect detection unit so as to inspect an inspection region, which is determined based on a detected position of the first defect, and a thickness and the off angle of the semiconductor wafer, and is a partial region of the second main surface of the semiconductor wafer, when the defect detection unit detects the second defect.

2. The semiconductor inspection apparatus according to claim 1, wherein when the thickness and the off angle of the semiconductor wafer are denoted by T and θ, respectively, the inspection region includes a first defect corresponding position that is a position on the second main surface of the semiconductor wafer away from the detected position of the first defect by a distance of T×tan θ in the predetermined direction in plan view.

3. The semiconductor inspection apparatus according to claim 2, wherein the inspection region includes only the first defect corresponding position on the second main surface of the semiconductor wafer.

4. The semiconductor inspection apparatus according to claim 2, further comprising a determination circuitry that determines that the first defect and the second defect are micropipe defects penetrating the first main surface and the second main surface of the semiconductor wafer when a detected position of the second defect coincides with the first defect corresponding position.

5. The semiconductor inspection apparatus according to claim 1, further comprising a storage unit that stores the detected position of the first defect detected by the defect detection unit, wherein the control circuitry determines the inspection region based on the detected position of the first defect stored in the storage unit.

6. The semiconductor inspection apparatus according to claim 1, wherein the defect detection unit includes an observation unit, and the observation unit detects the first defect based on an image of the first main surface captured as an inspection of the first main surface of the semiconductor wafer, or detects the second defect based on an image of the inspection region of the second main surface captured as an inspection of the second main surface of the semiconductor wafer.

7. The semiconductor inspection apparatus according to claim 1, wherein the defect detection unit includes a displacement measurement unit, and the displacement measurement unit detects the first defect based on displacement in the first main surface measured as an inspection of the first main surface of the semiconductor wafer, or detects the second defect based on displacement in the inspection region of the second main surface measured as an inspection of the second main surface of the semiconductor wafer.

8. The semiconductor inspection apparatus according to claim 1, wherein the defect detection unit includes a first defect detection unit that inspects the first main surface of the semiconductor wafer and a second defect detection unit that inspects the second main surface of the semiconductor wafer.

9. The semiconductor inspection apparatus according to claim 8, wherein the first defect detection unit includes an observation unit, the second defect detection unit includes a displacement measurement unit, the observation unit detects the first defect based on an image of the first main surface captured as an inspection of the first main surface of the semiconductor wafer, and the displacement measurement unit detects the second defect based on displacement in the inspection region of the second main surface measured as an inspection of the second main surface of the semiconductor wafer.

10. The semiconductor inspection apparatus according to claim 8, wherein the first defect detection unit includes a displacement measurement unit, the second defect detection unit includes an observation unit, the displacement measurement unit detects the first defect based on displacement in the first main surface measured as an inspection of the first main surface of the semiconductor wafer, and the observation unit detects the second defect based on an image of the inspection region of the second main surface captured as an inspection of the second main surface of the semiconductor wafer.

11. The semiconductor inspection apparatus according to claim 1, further comprising a holding unit that holds an outer peripheral portion of the semiconductor wafer, wherein the holding unit includes reversing member that reverses the semiconductor wafer such that a position of the first main surface and a position of the second main surface of the semiconductor wafer are switched.

12. The semiconductor inspection apparatus according to claim 1, further comprising a holding unit that holds an outer peripheral portion of the semiconductor wafer, wherein the holding unit includes three or more gripping portions, and each of the three or more gripping portions sandwiches and holds the semiconductor wafer from both sides of the first main surface and the second main surface of the semiconductor wafer.

13. The semiconductor inspection apparatus according to claim 1, further comprising a holding unit that holds an outer peripheral portion of the semiconductor wafer, wherein the holding unit holds the semiconductor wafer in a vertical direction.

14. A method of inspecting a semiconductor wafer, the method comprising:

inspecting a first main surface of a semiconductor wafer including an SiC crystal having the first main surface and a second main surface and inclined at an off angle in a predetermined direction to detect a first defect which is a crystal defect included in the first main surface;

inspecting the second main surface of the semiconductor wafer after detecting the first defect to detect a second defect that is a crystal defect included in the second main surface; and controlling, when detecting the second defect, detecting the second defect such that the inspection region, which is an inspection region determined based on the detected position of the first defect, and a thickness and the off angle of the semiconductor wafer, and is a partial region of the second main surface of the semiconductor wafer, is inspected.

15. The method of inspecting a semiconductor wafer according to claim 14, wherein when the thickness and the off angle of the semiconductor wafer are denoted by T and θ, respectively, the inspection region includes a first defect corresponding position that is a position on the second main surface of the semiconductor wafer away from the detected position of the first defect by a distance of $T\times\tan\theta$ in the predetermined direction in plan view.

16. The method of inspecting a semiconductor wafer according to claim 15, the method further comprising determining that the first defect and the second defect are micropipe defects penetrating the first main surface and the second main surface of the semiconductor wafer when the detected position of the second defect coincides with the first defect corresponding position.

17. The method of inspecting a semiconductor wafer according to claim 14, wherein the semiconductor wafer is held in a vertical direction.

18. A method of manufacturing a semiconductor device, the method comprising:

inspecting a first main surface of a semiconductor wafer including an SiC crystal having the first main surface and a second main surface and inclined at an off angle in a predetermined direction to detect a first defect which is a crystal defect included in the first main surface;

inspecting the second main surface of the semiconductor wafer after detecting the first defect to detect a second defect that is a crystal defect included in the second main surface; and controlling, when detecting the second defect, the step of detecting the second defect such that the inspection region, which is an inspection region determined based on the detected position of the first defect, and a thickness and the off angle of the semiconductor wafer, and is a partial region of the second main surface of the semiconductor wafer, is inspected.

19. The method of manufacturing a semiconductor device according to claim 18, wherein when the thickness and the off angle of the semiconductor wafer are denoted by T and θ, respectively, the inspection region includes a first defect corresponding position that is a position on the second main surface of the semiconductor wafer away from the detected position of the first defect by a distance of $T\times\tan\theta$ in the predetermined direction in plan view.

20. The method of manufacturing a semiconductor device according to claim 19, further comprising determining that the first defect and the second defect are micropipe defects penetrating the first main surface and the second main surface of the semiconductor wafer when the detected position of the second defect coincides with the first defect corresponding position.

* * * * *